(12) United States Patent
Ahrens et al.

(10) Patent No.: US 6,798,042 B2
(45) Date of Patent: Sep. 28, 2004

(54) PIN DIODE AND METHOD FOR FABRICATING THE DIODE

(75) Inventors: Carsten Ahrens, München (DE); Raimund Peichl, Höhenkirchen-Siegertsbrunn (DE); Reinhard Gabl, München (DE)

(73) Assignee: Infineon Technologies AG, Munich (DE)

( * ) Notice: Subject to any disclaimer, the term of this patent is extended or adjusted under 35 U.S.C. 154(b) by 37 days.

(21) Appl. No.: 10/271,286

(22) Filed: Oct. 15, 2002

(65) Prior Publication Data

US 2003/0062581 A1 Apr. 3, 2003

Related U.S. Application Data

(63) Continuation of application No. PCT/EP01/03903, filed on Apr. 5, 2001.

(30) Foreign Application Priority Data

Apr. 14, 2000 (EP) .......................................... 00108252

(51) Int. Cl.[7] .............................................. H01L 29/06
(52) U.S. Cl. ................................................ 257/622
(58) Field of Search ........................................ 257/622

(56) References Cited

U.S. PATENT DOCUMENTS

| | | | | |
|---|---|---|---|---|
| 3,644,801 A | * | 2/1972 | Sheldon | 257/622 |
| 4,974,050 A | | 11/1990 | Fuchs | 257/496 |
| 5,861,674 A | | 1/1999 | Ishikawa | 257/758 |
| 6,380,607 B2 | * | 4/2002 | Seo | 257/522 |

FOREIGN PATENT DOCUMENTS

JP        59035482        2/1984

\* cited by examiner

*Primary Examiner*—Gene M. Munson
(74) *Attorney, Agent, or Firm*—Laurence A. Greenberg; Werner H. Stemer; Gregory L. Mayback

(57) ABSTRACT

The invention is a diode having at least one trench in the semiconductor substrate and insulation configured on the surface of the semiconductor substrate so that the trench limits the depletion region of the diode and the area over which an electrode is in direct contact with the diffusion region of the diode is limited by the insulation. The diode has the advantage that the extent of the depletion region, and thus the area capacitance of the diode, and the size of the electrode are decoupled from one another. The lateral extent of the depletion region can be chosen independently of the size of the electrode.

24 Claims, 3 Drawing Sheets

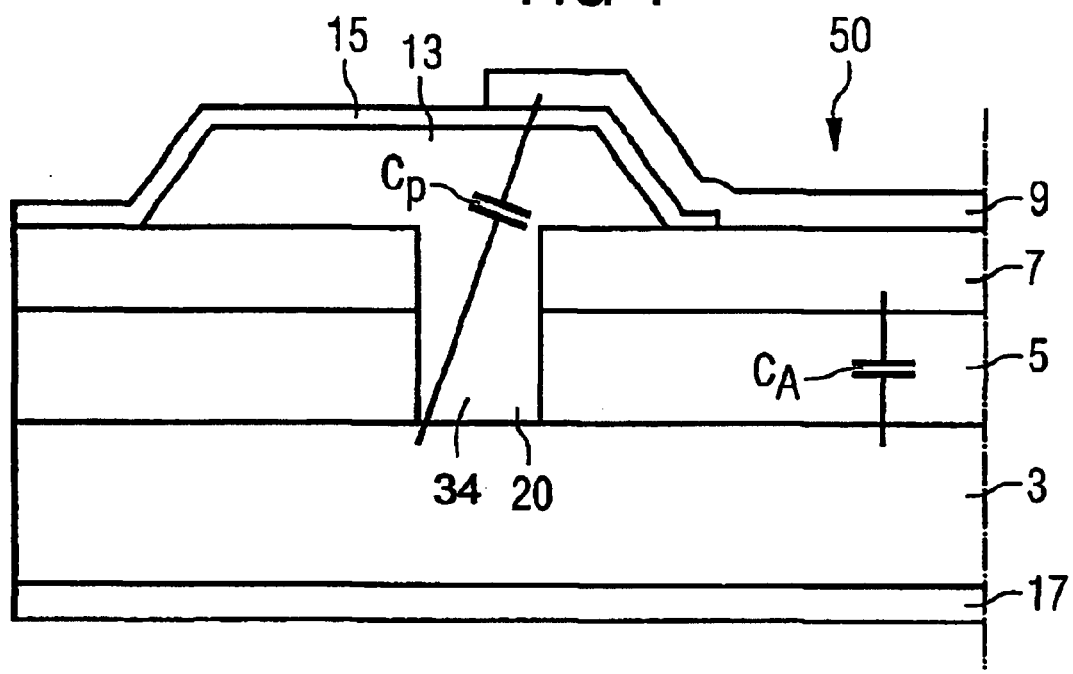
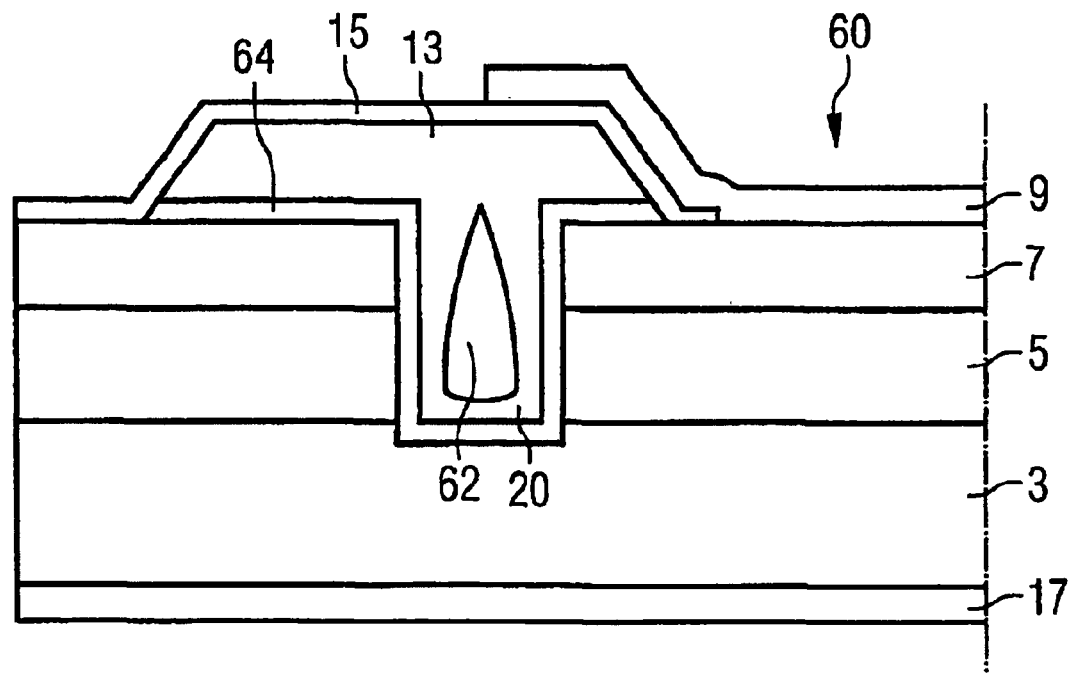

Prior Art FIG 5
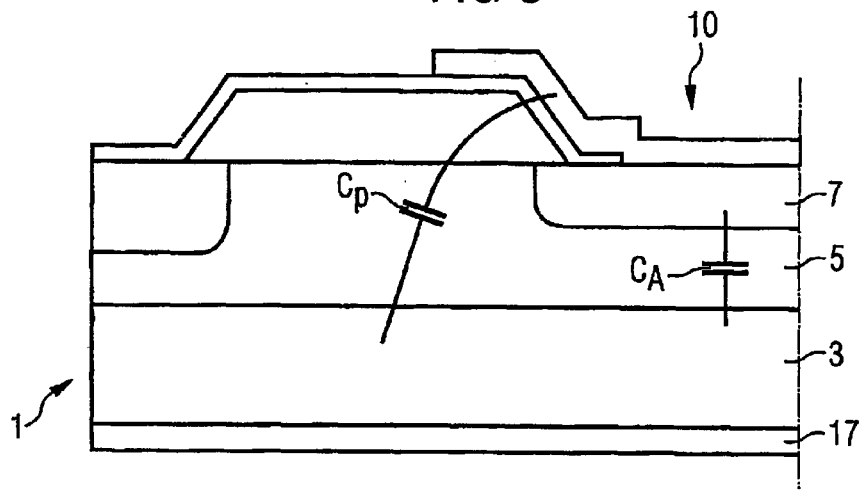
Prior Art FIG 6
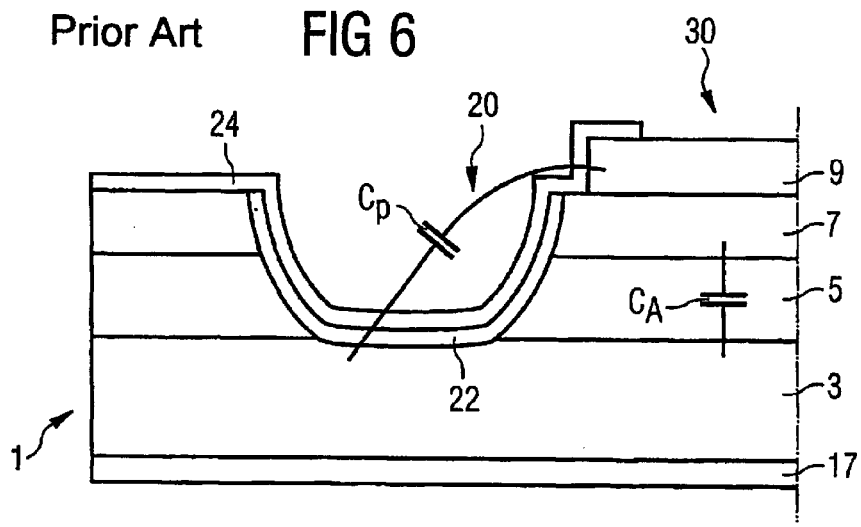

PIN DIODE AND METHOD FOR FABRICATING THE DIODE

CROSS-REFERENCE TO RELATED APPLICATION

This application is a continuation of copending International Application No. PCT/EP01/03903, filed Apr. 5, 2001, which designated the United States and was not published in English.

BACKGROUND OF THE INVENTION

Field of the Invention

The invention relates to a diode and a method for fabricating it. The invention relates, in particular, to a PIN diode. Diodes of this type are used, for example, in discrete circuits for switching radio frequency signals.

Diodes are used as rectifiers and switches in many areas of electronics and are offered commercially in various configurations. Applications as switches in the radio frequency range require diodes with a low blocking capacitance ($C_T$) for an applied reverse-biased voltage, and a low forward resistance ($r_f$) for a forward-biased voltage, which leads to low attenuation in the forward direction and high insulation in the reverse direction. One quality feature for PIN diodes is the product $C_T*r_f$.

The blocking capacitance of a diode, $C_T$, is composed of an area capacitance, $C_A$, and a fringing capacitance, $C_P$. The area capacitance is dominant in large-area diodes. It is determined by the surface area and also the thickness of the depletion layer of the diode, which forms for a given voltage between the regions of different conductivity. Furthermore, the blocking capacitance is determined by the material of the semiconductor substrate or the relative permittivity of the semiconductor material. In the case of silicon, the relative permittivity is relatively high, with $\epsilon=12$.

The fringing capacitance encompasses all of the capacitances of a diode that cannot be assigned to the area capacitance. Examples of this are capacitances that are determined by the supply line and contact-making areas. The fringing capacitance is dominant primarily in small-area diodes.

The forward resistance can be minimized primarily by using short paths in the semiconductor substrate. This is achieved e.g. by the current, which enters from the front side through the diffusion layer, emerging again on the rear side of the semiconductor substrate. The rear side of this substrate has previously been thinned.

The PIN diodes have become established in the radio frequency range right into the GHz range (e.g. the diode family BAR-63 from Infineon Technologies AG). The active region of these diodes essentially includes three regions, a highly doped diffusion region of a first conduction type, a quasi intrinsic region with no doping or only very low doping and a highly doped region of a second conduction type. In the case of these diodes, the thickness of the depleted region is given essentially by the thickness of the intrinsic region, since the intrinsic region is completely depleted of free charge carriers even at very small voltages on account of the low doping. A relatively thick intrinsic region makes it possible to produce diodes that have very low blocking capacitances even at small voltages.

FIG. 5 is a cross sectional view taken through a prior art rotationally symmetrical planar PIN diode 10. The figure shows the semiconductor substrate 1, which has a p-conducting substrate region 3 and an intrinsic substrate region 5. The intrinsic substrate region 5 is generally realized by an undoped or only weakly doped epitaxial layer. The intrinsic region 5 is non-conducting and therefore acts as a kind of dielectric between the n-conducting diffusion region 7 and the p-conducting region 3. Furthermore, the diode has a rear side contact 17, which is preferably realized by a gold-arsenic layer, so that the rear side serves as a second contact of the diode. In order to minimize the resistance of the diode, the rear side of the semiconductor substrate is thinned.

The total capacitance of the diode is given by the sum of the area capacitance $C_A$ and the fringing capacitance $C_P$, which are both depicted diagrammatically in FIG. 5. If the diode area is small, then the influence of the fringing capacitance must increasingly be taken into account. The fringing capacitance $C_P$ in FIG. 5 is relatively large, since the dielectric constant is essentially prescribed by the depleted silicon, which has a high dielectric constant ($\epsilon=12$).

In order to reduce the fringing capacitance $C_P$, so-called mesa diodes are often used for applications in radio frequency technology. FIG. 6 shows a cross sectional view taken through a rotationally symmetrical mesa PIN diode 30. In this case, due to the mesa structure, the fringing capacitance $C_P$ is significantly reduced in comparison with the diode shown in FIG. 5, since in the trench 20, air is prescribed as the dielectric, and air has a low dielectric constant ($\epsilon=1$). The trench is covered by a trench oxide layer 22 and a nitride layer 24 lying on the latter, so that the silicon surface is passivated in the trench. The blocking capacitance of the diode typically lies below 400 fF.

For the same resistance in the forward direction, mesa PIN diodes make it possible to realize capacitances in the reverse direction that are approximately 15% smaller than the capacitances that are possible with a planar diode. A further advantage of a mesa PIN diode resides in the shorter turn-off time. This can be attributed to the fact that, as a result of the lateral delimitation of the charge carriers, during the switch-off, no charges can be removed from the edge region of the diode, as is the case with a planar diode.

However, the diode shown in FIG. 6 has the disadvantage that, for a given thickness of the intrinsic region, the junction capacitance is downwardly limited by the size of the electrode 9 that is required for contact-making. The area of the electrode 9 cannot be arbitrarily reduced, since later it is necessary to apply a bonding wire or another terminal connection on this area. This bonding wire or terminal connection connects the diode e.g. to a housing PIN. Conventional bonding methods require a bonding bearing area of about 10,000 $\mu m^2$ or more. This generally has the consequence that the size of the diffusion region 7 also cannot be reduced, since the contact-making area required for a microwelding connection must maintain a minimum size. Since the size of the electrode 9 is prescribed by the area required for contact-making, e.g. by a bonding wire, the reduction of the blocking capacitance of the diode is limited by this area. A further disadvantage is that, in the case of small diodes and thus also small contact-making areas, e.g. a bonding base of a bonding wire can reach across the contact area and can damage the insulating layers 22 and 24 even in the event of very small misalignments.

SUMMARY OF THE INVENTION

It is accordingly an object of the invention to provide a diode and a method for producing the diode which overcomes the above-mentioned disadvantages of the prior art apparatus and methods of this general type.

In particular, the object of the invention is to provide a diode having a desired, i.e. minimum, blocking capacitance even in the case of a predetermined minimum bonding area. Furthermore, the diode is intended to have the typical switching behavior of a mesa PIN diode.

With the foregoing and other objects in view there is provided, in accordance with the invention, a diode that in particular can be used for applications in radio frequency technology, including: a semiconductor substrate having a surface, a first region of a first conductivity type, a second region of a second conductivity type, and a depletion region between the first region and the second region being formed when the diode is operated in a reverse direction; at least one electrode configured on the surface of the semiconductor substrate, the first region having an area being directly electrically connected to the electrode; at least one trench formed in the semiconductor substrate; and insulation configured on the surface of the semiconductor substrate. The trench limits the depletion region that is formed when the diode is being operated in the reverse direction. The insulation limits the area of the first region that is directly electrically connected to the electrode.

The diode has the advantage that the extent of the depletion region, and thus the area capacitance of the diode, and the size of the electrode are decoupled from one another. The lateral extent of the depletion region can be chosen independently of the size of the electrode. The part of the electrode that is not in direct contact with the first region, but is necessary to provide a sufficiently large area for a bonding wire is arranged on the insulation. The insulation makes it possible to keep a part of the electrode at a sufficient distance from the semiconductor substrate, as a result of which the capacitance of the diode is reduced.

Therefore, the lateral extent of the depletion region can be optimally adapted to the respective application without having to consider problems that can result from bonding the diode. Furthermore, the diode has essentially the same small fringing capacitance as a mesa diode. The trench in the semiconductor substrate helps to lower the fringing capacitance of the electrode with respect to the semiconductor substrate, since rather than silicon with $\in=12$, a material with a lower dielectric constant, e.g. silicon oxide with $\in=4$ or gas with $\in=1$, is provided in the edge region.

The trench is preferably filled with an insulating filling material having the smallest possible dielectric constant. The filling and also the insulation at the substrate surface have the effect that e.g. the bonding base of a bonding wire cannot project into the trench and the capacitance of the diode thus increases. The filling material should preferably have a dielectric constant that is less than that of silicon.

The diode preferably has a PIN diode structure, i.e. the semiconductor substrate has an undoped or only very weakly doped region on the surface. This very weakly doped region, also called an intrinsic region, is usually grown by an epitaxial method on the more highly doped semiconductor substrate. Therefore, for a given area geometry, the thickness of this epitaxial layer largely determines the capacitance of the diode.

A preferred filling material for the trench is silicon oxide. In a preferred embodiment, a borophosphosilicate glass (BPSG) oxide, in particular, is used for the filling of the trench. In accordance with a further preferred embodiment, prior to the filling, trench bottom and trench wall are covered with a layer made of undoped silicate glass, in order to minimize the area state density at the trench surface.

A cavity is preferably provided in the trench. A cavity leads to a further reduction of the fringing capacitance, since the dielectric constant of gas (air), with $\in=1$, is significantly lower than that of silicon oxide.

The cavity or cavities are preferably fabricated in the insulating filling material by filling the cavity by a non-conformal deposition. During such a deposition, a so-called "shrink hole formation" arises since the trench cannot be completely filled on account of the increased deposition at the upper edge of the trench.

The electrode preferably contains aluminum, since a good ohmic contact on silicon can be realized with this material, and aluminum is well suited to contact-making with bonding wires made of gold or aluminum. Furthermore, it is preferred if more than 20%, and preferably more than 40%, of the electrode is arranged above the insulation.

With the foregoing and other objects in view there is also provided, in accordance with the invention, a method for fabricating a diode. The method includes steps of: providing a semiconductor substrate having a surface, a first region of a first conductivity type, a second region of a second conductivity type, and a depletion region forming between the first region and the second region when the diode is operated in a reverse direction; forming at least one trench limiting the depletion region; filling the trench with an insulating filling material; producing insulation on the surface of the semiconductor substrate; and producing an electrode on the surface of the semiconductor substrate such that the electrode is directly electrically connected to an area of the first region and the area is limited by the insulation.

In accordance with an added feature of the invention, the method includes: providing the semiconductor substrate with an intrinsic region.

In accordance with an additional feature of the invention, the method includes: performing the step of forming the trench by anisotropic etching.

In accordance with another feature of the invention, the method includes: coating walls and a bottom of the trench with an undoped silicate glass layer.

In accordance with a further feature of the invention, the method includes: performing the step of filling the trench by performing a non-conformal silicon oxide deposition so that a cavity forms in the trench.

In accordance with a further added feature of the invention, the method includes: using a BPSG process to perform the step of silicon oxide deposition.

In accordance with yet an added feature of the invention, the method includes: performing the step of filling the trench and performing the step of producing the insulation by depositing a silicon oxide layer and subsequently patterning the silicon oxide layer.

In accordance with yet an additional feature of the invention, the method includes: patterning the insulation in a trapezoid form.

In accordance with yet a further feature of the invention, the method includes: thinning a rear side of the semiconductor substrate.

In accordance with yet a further added feature of the invention, the method includes: providing a second contact on a rear side of the semiconductor substrate.

Other features which are considered as characteristic for the invention are set forth in the appended claims.

Although the invention is illustrated and described herein as embodied in a diode and method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a cross sectional view taken through an inventive rotationally symmetrical PIN diode;

FIG. 2 is a cross sectional view taken through a second embodiment of the rotationally symmetrical PIN diode;

FIG. 5 is a cross sectional view taken through a prior art rotationally symmetrical PIN diode; and FIG. 6 is a cross sectional view taken through a prior art rotationally symmetrical mesa PIN diode.

DESCRIPTION OF THE PREFERRED EMBODIMENTS

Figure 3:
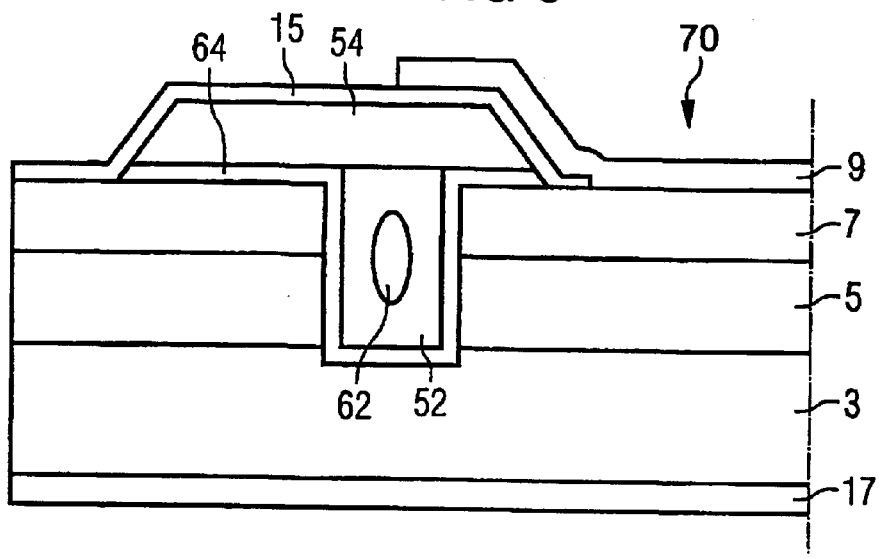
FIG. 3 is a cross sectional view taken through a third embodiment of the rotationally symmetrical PIN diode that has a trench filled with a BPSG oxide, a wall and a cavity.

Referring now to the figures of the drawing in detail and first, particularly, to FIG. 1 thereof, there is shown a cross sectional view taken through a first embodiment of a PIN diode 50. The PIN diode 50 has a highly doped n-conducting silicon substrate 3 (n-conducting region). A lightly doped n-conducting region 5 (intrinsic region) is arranged on the n-conductiong silicon substrate 3. In the present example, the intrinsic region 5 was produced using an epitaxy method. The depletion region forms in the intrinsic region 5, if the PIN diode is operated in the reverse direction. A highly doped p-conducting region 7 is arranged above intrinsic region 5. The p-conducting region 7 was produced by implanting boron into the upper region of the epitaxial layer and then by outdiffusing the boron by performing a thermal treatment.

Proceeding from the surface of the p-conducting region 7, a trench 20 produced by anisotropic etching reaches right into the n-conducting silicon substrate 3. The trench 20 limits the lateral extent of the depletion region, if the PIN diode 50 is operated in the reverse direction. At the same time, the trench 20 forms a barrier for the charge carriers injected into the intrinsic region 5, if the PIN diode is operated in the forward direction. In the present example, the width of the trench is about 1.6 $\mu$m. The depth of the trench is dependent on the thickness of the epitaxial layer and is 6 $\mu$m in the present example.

The trench 20 is filled with an oxide having a low dielectric constant ($\in$=4). In the present example, the trench was filled by a Plasma Enhanced Chemical Vapor Deposition (PECVD) oxide 54. To that end, the oxide layer was deposited conformally up to a thickness of about 6 $\mu$m on the epitaxial layer. The trench was filled virtually completely as a result of the conformal deposition. A virtually planar oxide surface results at the same time. Afterward, the oxide 54 was concomitantly patterned to form insulation 13. A silicon nitride layer 15 was then deposited and likewise pat erned, as a result of which a passivation was produced on the surface of the diode.

Afterward, an aluminum electrode 9 was produced on the front side. In this case, the electrode area required for the later bonding of the diode is provided by configuring a large part of the electrode above the insulation 13 (more than 60%) and by directly connecting only a small part of the electrode 9 to the p-conducting region 7. Finally, the silicon substrate 3 is thinned by performing a grinding operation, and a rear side contact 17 is applied. To that end, in the present example, a gold/arsenic alloy was applied to the rear side of the silicon substrate 3.

FIG. 2 shows a cross section through a second embodiment of a PIN diode 60. The PIN diode 60 is constructed essentially like the diode shown in FIG. 1, but the trench 20 was filled in a different way. Before the application of a PECVD oxide layer, the trench 20 and the semiconductor substrate area were covered with an undoped silicate glass layer 64, in order to minimize the surface state density at the trench wall. Afterward, the PECVD oxide layer was produced up to a thickness of about 6 $\mu$m by performing a non-conformal CVD deposition. During such a deposition, a so-called "shrink hole formation" arises since the trench cannot be completely filled on account of the increased deposition at the upper edge of the trench. As a result, a cavity 62 was produced in the trench 20. At the same time, a virtually planar oxide surface again results. Afterward, the oxide was concomitantly patterned. A silicon nitride layer 15 was then deposited and likewise patterned, as a result of which a passivation was produced on the surface of the diode.

The cavity 62 helps to lower the fringing capacitance of the diode further, since the gas in the cavity, with a dielectric constant of about $\in$=1, has a significantly lower dielectric constant than the surrounding silicon oxide. In this case, the process parameters were chosen such that the cavity takes up more than 40% of the volume in the trench.

FIG. 3 shows a cross sectional view taken through a third embodiment of a PIN diode 70. It differs from the embodiment illustrated in FIG. 2 by virtue of the fact that the trench 20 was filled with a different oxide. In the case of the embodiment shown in FIG. 3, the trench was filled with a BPSG oxide 52. To that end, a BPSG oxide layer was deposited, which was planarized by flowing. Afterward, the BPSG oxide layer was etched back by an etching method, and the trench 20 was closed except for the cavity 62. Afterward, a PECVD oxide layer 54 was deposited and patterned to form insulation 13 above the trench 20. The passivation was subsequently produced with the aid of the silicon nitride layer 15.

This construction makes it possible, for example, to produce a round diode whose depletion region has a radius of about 60 $\mu$m, in which the electrode required for bonding has a radius of 110 $\mu$m. The large electrode area enables a bonding wire to be mounted without problems and without impairing the blocking capacitance in the process. By contrast, previous MESA PIN diodes have a depletion region with a minimum radius of about 70 $\mu$m. It is not possible to reduce the size of the depletion region further in the case of these diodes.

Figure 4A:
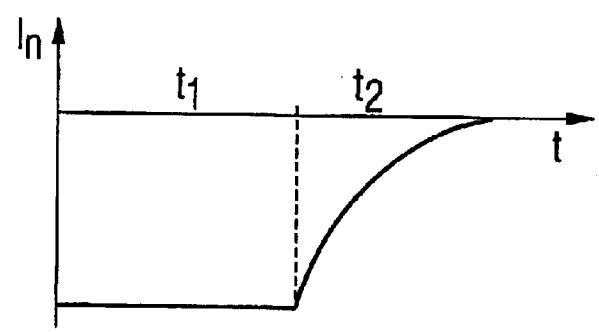
FIGS. 4A, 4B show the turn-off characteristic of a conventional planar diode in comparison with the turn-off characteristic of the inventive diode.
Figure 4B:
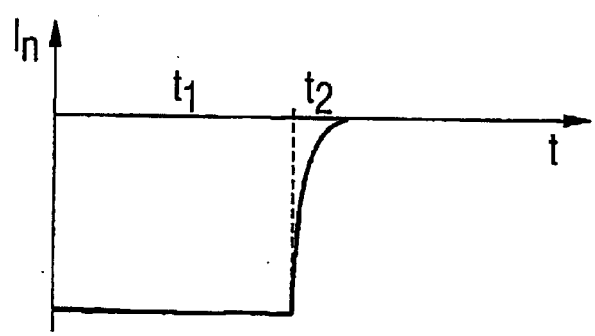

FIGS. 4A and 4B show the resulting time profiles of the current when a conventional, planar PIN diode (FIG. 4A) and the inventive diode 50, 60, or 70 (FIG. 4B) are discharged or turned off via a resistor. It is evident that this turn-off characteristic is divided into two time periods t1 and t2. The current is virtually constant within time period t1. This time period is characterized in that the charge carrier concentration at the edge of the intrinsic zone toward the highly doped terminals is still higher than the intrinsic concentration. The time t1 is essentially dependent on the charge injected into the intrinsic zone and the discharge current.

The current decays in the time period t2. Physically, this time period is dominated by diffusion and recombination in the intrinsic zone. The time t2 depends on the size of the surface of the injection region with regard to the highly doped terminals. In the case of the inventive diode, this surface is significantly smaller as a result of lateral delimitation of the charge carriers. Accordingly, the discharge current decays significantly more rapidly in the case of the inventive diode 50, 60, or 70 than is the case with a conventional planar PIN diode. Since the time t1 depends on the discharge current, whereas the time t2 is practically independent of the electrode voltage, steeper turn-off edges are achieved with the inventive diode. Consequently, the turn-off characteristic of the inventive diode essentially corresponds to the turn-off characteristic of a mesa PIN diode.

We claim:

1. A diode, comprising:
   a semiconductor substrate having a surface, a first region of a first conductivity type, a second region of a second conductivity type, and a depletion region between said first region and said second region being formed when the diode is operated in a reverse direction;
   at least one electrode configured on said surface of said semiconductor substrate, said first region having an area being directly electrically connected to said electrode;
   at least one trench formed in said semiconductor substrate; and
   insulation configured on said surface of said semiconductor substrate with more than 20% of said electrode being configured above said insulation;
   said trench limiting said depletion region being formed when the diode is being operated in the reverse direction; and
   said insulation limiting said area of said first region being directly electrically connected to said electrode.

2. The diode according to claim 1, comprising: an intrinsic region located between said first region and said second region.

3. The diode according to claim 1, wherein: said insulation is configured above said trench.

4. The diode according to claim 1, comprising: an insulating filling material partially filling said trench.

5. The diode according to claim 4, wherein: said insulating filling material is a borophosphosilicate glass (BPSG) oxide.

6. The diode according to claim 4, wherein: said insulating filling material is a Plasma Enhanced Chemical Vapor Deposition (PECVD) oxide.

7. The diode according to claim 4, wherein: said insulating filling material is of a material being identical to said insulation.

8. The diode according to claim 1, wherein: said trench is formed with at least one cavity.

9. The diode according to claim 1, wherein: said insulation is made of a Plasma Enhanced Chemical Vapor Deposition (PECVD) oxide.

10. The diode according to claim 1, wherein: said electrode is made of aluminum.

11. The diode according to claim 1, comprising:
    a second electrode;
    said semiconductor substrate having a rear side at which said second electrode is configured.

12. The diode according to claim 1, wherein: said semiconductor substrate has a thinned rear side.

13. A diode, comprising:
    a semiconductor substrate having a surface, a first region of a first conductivity type, a second region of a second conductivity type, and a depletion region between said first region and said second region being formed upon the diode being operated in a reverse direction;
    at least one electrode configured on said surface of said semiconductor substrate, said first region having a area being directly electrically connected to said electrode;
    an undoped silicate glass layer;
    said semiconductor substrate having at least one trench formed therein, said trench being formed with a trench bottom and trench walls covered by said undoped silicate glass layer;
    insulation configured on said surface of said semiconductor substrate;
    said trench limiting said depletion region being formed when the diode is being operated in the reverse direction; and
    said insulation limiting said area of said first region being directly electrically connected to said electrode.

14. A diode, comprising:
    a semiconductor substrate having a surface, a first region of a first conductivity type, a second region of a second conductivity type, and a depletion region between said first region and said second region being formed upon the diode being operated in a reverse direction;
    at least one electrode configured on said surface of said semiconductor substrate, said first region having an area being directly electrically connected to said electrode;
    said semiconductor substrate having at least one trench formed therein;
    insulation configured on said surface of said semiconductor substrate with more than 40% of said electrode being configured above said insulation;
    said trench limiting said depletion region being formed when the diode is being operated in the reverse direction; and
    said insulation limiting said area of paid first region being directly electrically connected to said electrode.

15. A method for fabricating a diode, which comprises:
    providing a semiconductor substrate having a surface, a first region of a first conductivity type, a second region of a second conductivity type, and a depletion region forming between the first region and the second region when the diode is operated in a reverse direction;
    forming at least one trench limiting the depletion region;
    filling the trench with an insulating filling material;
    producing insulation on the surface of the semiconductor substrate; and
    producing an electrode on the surface of the semiconductor substrate such that the electrode is directly electrically connected to an area of the first region and the area is limited by the insulation with more than 20% of said electrode being configured above said insulation.

16. The method according to claim 15, which comprises: providing the semiconductor substrate with an intrinsic region.

17. The method according to claim 15, which comprises: performing the step of forming the trench by anisotropic etching.

18. The method according to claim 15, which comprises: coating walls and a bottom of the trench with an undoped silicate glass layer.

19. The method according to claim 15, which comprises: performing the step of filling the trench by performing a non-conformal silicon oxide deposition so that a cavity forms in the trench.

20. The method according to claim 19, which comprises: using a borophosphosilicate glass (BPSG) process to perform the step of silicon oxide deposition.

21. The method according to claim 15, which comprises:

performing the step of filling the trench and performing the step of producing the insulation by depositing silicon oxide layer and subsequently patterning the silicon oxide layer.

22. The method according to claim 15, which comprises: patterning the insulation in a trapezoid form.

23. The method according to claim 15, which comprises: thinning a rear side of the semiconductor substrate.

24. The method according to claim 15, which comprises: providing a second contact on a rear side of the semiconductor substrate.

* * * * *